(12) United States Patent
Xu

(10) Patent No.: US 11,538,877 B2
(45) Date of Patent: Dec. 27, 2022

(54) DISPLAY PANEL AND METHOD OF MANUFACTURING DISPLAY PANEL

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Peng Xu, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 134 days.

(21) Appl. No.: 17/054,902

(22) PCT Filed: Apr. 20, 2020

(86) PCT No.: PCT/CN2020/085553
§ 371 (c)(1),
(2) Date: Nov. 12, 2020

(87) PCT Pub. No.: WO2020/233305
PCT Pub. Date: Nov. 26, 2020

(65) Prior Publication Data
US 2021/0257422 A1    Aug. 19, 2021

(30) Foreign Application Priority Data
May 20, 2019    (CN) .......................... 201910419150.9

(51) Int. Cl.
*H01L 27/32* (2006.01)
*H01L 51/56* (2006.01)
(Continued)

(52) U.S. Cl.
CPC ...... *H01L 27/3246* (2013.01); *H01L 27/3216* (2013.01); *H01L 51/0012* (2013.01);
(Continued)

(58) Field of Classification Search
CPC ... H01L 51/0012; H01L 27/3211–3218; H01L 27/3246
See application file for complete search history.

(56) References Cited

U.S. PATENT DOCUMENTS

2009/0001358 A1    1/2009  Park et al.
2009/0015523 A1*   1/2009  Matsudate .......... H01L 27/3211
                                                    315/169.3
(Continued)

FOREIGN PATENT DOCUMENTS

CN    108807465 A    11/2018
CN    109136835 A    1/2019
CN    109638020 A    4/2019

OTHER PUBLICATIONS

Machine translation, Xia, Chinese Pat. Pub. No. CN 109638020A, translation date: May 20, 2022, Espacenet, all pages. (Year: 2022).*

(Continued)

*Primary Examiner* — Victoria K. Hall
(74) *Attorney, Agent, or Firm* — Dinsmore & Shohl LLP

(57) ABSTRACT

The present disclosure relates to an organic light emitting diode display panel and a method of manufacturing the organic light emitting diode display panel. A display panel, including: a plurality of first light emitting layers arranged in an array in a first direction and a second direction; and a pixel defining layer including a plurality of first openings, wherein each first opening has a reduced size in the first direction, so that the corresponding first light emitting zone defined by the first opening has a first misalignment tolerance range in the first direction, and has a second misalignment tolerance range in the second direction, the corresponding first light emitting zone is allowed to shift in the first direction within the first misalignment tolerance range without overlapping the shaded region of the corresponding first light emitting layer.

22 Claims, 10 Drawing Sheets

(51) Int. Cl.
*H01L 51/00* (2006.01)
*H01L 51/50* (2006.01)

(52) U.S. Cl.
CPC .......... *H01L 51/56* (2013.01); *H01L 27/3218* (2013.01); *H01L 51/5012* (2013.01); *H01L 2227/323* (2013.01); *H01L 2251/55* (2013.01); *H01L 2251/56* (2013.01)

(56) References Cited

U.S. PATENT DOCUMENTS

| | | | |
|---|---|---|---|
| 2018/0315806 A1 | 11/2018 | Lee et al. | |
| 2019/0096864 A1* | 3/2019 | Huitema | H01L 33/62 |
| 2019/0252469 A1* | 8/2019 | Xiao | H01L 27/326 |
| 2020/0035156 A1* | 1/2020 | Yanase | H01L 27/3276 |
| 2020/0185477 A1 | 6/2020 | Xia | |
| 2021/0217959 A1* | 7/2021 | Huang | H01L 51/0012 |
| 2021/0273028 A1* | 9/2021 | Wu | H01L 27/3216 |
| 2022/0005896 A1* | 1/2022 | Abe | G09F 9/40 |

OTHER PUBLICATIONS

Machine translation, Zhang, Chinese Pat. Pub. No. CN 109136835A, translation date: May 20, 2022, Espacenet, all pages. (Year: 2022).*
Written Opinion of International Searching Authority, International Searching Authority, International Application No. PCT/CN2020/085553, dated Jul. 21, 2020, all pages. (Year: 2020).*
International Search Report, International Searching Authority, International Application No. PCT/CN2020/085553, dated Jul. 21, 2020, all pages. (Year: 2020).*
First Office Action, The State Intellectual Property Office of People's Republic of China, Application No. 201910419150.9, dated Apr. 6, 2021, all pages. (Year: 2021).*

* cited by examiner

DISPLAY PANEL AND METHOD OF MANUFACTURING DISPLAY PANEL

CROSS REFERENCE TO RELATED APPLICATIONS

This application is a U.S. National Stage under 35 U.S.C. § 371 of International Application No. PCT/CN2020/085553, filed on Apr. 20, 2020, which claims priority to Chinese Patent Application No. 201910419150.9 filed on May 20, 2019. Both of the aforementioned applications are hereby incorporated by reference in their entireties.

TECHNICAL FIELD

The present disclosure relates to the field of display technology, in particular to a display panel and a method of manufacturing the display panel.

BACKGROUND

In an organic light emitting diode display panel, the light emitting layer of the sub-pixel is formed by evaporating an organic light emitting material using a mask. Due to the shadow effect of the mask, the formed organic light emitting layer may include a region with a normal thickness in the center of the organic light emitting layer (referred to as a "normal region" herein) and a region with a smaller thickness in the periphery of the organic light emitting layer (referred to as "shaded region" herein). The portion of the organic light emitting layer corresponding to the opening of the pixel defining layer (PDL) forms the light emitting zone of the sub-pixel. Under normal circumstances, the opening of the PDL is formed so that the light emitting zone includes only a part of the normal area.

SUMMARY

According to a first aspect of the present disclosure, there is provided a display panel, including a plurality of first light emitting layers configured to emit a light of a first color when excited, the first light emitting layers are arranged in an array in a first direction and a second direction intersecting the first direction, each first light emitting layer includes a shaded region, the shaded region is a peripheral region of the first light emitting layer and has a thickness less than a first thickness threshold; and a pixel defining layer including a plurality of first openings covered by corresponding first light emitting layers, the plurality of first openings defining respective first light emitting zones of the plurality of first light emitting layers, wherein each first opening has a reduced size in the first direction, so that the corresponding first light emitting zone defined by the first opening has a first misalignment tolerance range in the first direction, and has a second misalignment tolerance range in the second direction, the corresponding first light emitting zone is allowed to shift in the first direction within the first misalignment tolerance range without overlapping the shaded region of the corresponding first light emitting layer, and the corresponding first light emitting zone is allowed to shift in the second direction within the second misalignment tolerance range without overlapping the shaded region of the corresponding first light emitting layer, wherein the first misalignment tolerance range is substantially equal to the second misalignment tolerance range.

In some embodiments of the present disclosure, the first thickness threshold of the shaded region of each first light emitting layer is a standard thickness of the first light emitting layer multiplied by a percentage, and the standard thickness is a difference between a maximum thickness and a minimum thickness of the first light emitting layer.

In some embodiments of the present disclosure, the percentage is 98%.

In some embodiments of the present disclosure, each first opening is formed such that the corresponding first light emitting zone defined by the first opening has a first corner protruding in the first direction and a second corner protruding in the second direction.

In some embodiments of the present disclosure, the first corner has an edge rounded with a first radius, and the second corner has an edge rounded with a second radius, the first radius is greater than the second radius.

In some embodiments of the present disclosure, the first corner has an edge substantially parallel to the second direction, and the second corner has an edge rounded with a second radius.

In some embodiments of the present disclosure, the second radius is greater than or equal to 3 um.

In some embodiments of the present disclosure, the display panel further comprises a plurality of second light emitting layers configured to emit a light of a second color when excited, the second light emitting layers are arranged in an array in the first direction and the second direction; and a plurality of third light emitting layers configured to emit a light of a third color when excited, the third light emitting layers are arranged in an array in the first direction and the second direction, wherein the pixel defining layer further includes a plurality of second openings covered by corresponding second light emitting layers, the plurality of second openings defining respective second light emitting zones of the plurality of second light emitting layers; and a plurality of third openings covered by corresponding third light emitting layers, the plurality of third openings defining respective third light emitting zones of the plurality of third light emitting layers.

In some embodiments of the present disclosure, the first light emitting layers, the second light emitting layers, and the third light emitting layers are arranged to form a plurality of repeating units repeatedly arranged in the first direction and the second direction, each repeating unit includes two first light emitting layers, two second light emitting layers and four third light emitting layers, wherein the two first light emitting layers are respectively arranged in the ith row and (j+2)th column, and the (i+2)th row and jth column, the two second light emitting layers are respectively arranged in the ith row and jth column, and the (i+2)th row and (j+2)th column, and the four third light emitting layers are respectively arranged in the (i+1)th row and (j+1)th column, (i+1)th row and (j+3)th column, (i+3)th row and (j+1)th column, and (i+3)th row and (j+3)th column, where i and j are integers greater than or equal to 1.

In some embodiments of the present disclosure, each second light emitting layer includes a shaded region, the shaded region is a peripheral region of the second light emitting layer and has a thickness less than a second thickness threshold, and each second opening has a reduced size in the first direction, so that the corresponding second light emitting zone defined by the second opening has a third misalignment tolerance range in the first direction, and has a fourth misalignment tolerance range in the second direction, the corresponding second light emitting zone is allowed to shift in the first direction within the third misalignment tolerance range without overlapping the shaded region of the second light emitting layers, the corresponding second light emitting zone is allowed to shift in the second direction within the fourth misalignment tolerance range without overlapping the shaded regions of the corresponding second light emitting layer, wherein the third misalignment tolerance range is substantially equal to the fourth misalignment tolerance range.

In some embodiments of the present disclosure, the second thickness threshold of the shaded region of each second light emitting layer is a standard thickness of the second light emitting layer multiplied by a percentage, and the standard thickness is a difference between a maximum thickness and a minimum thickness of the second light emitting layer.

In some embodiments of the present disclosure, the percentage is 98%.

In some embodiments of the present disclosure, each second opening is formed such that the corresponding second light emitting zone defined by the second opening has a third corner protruding in the first direction and a fourth corner protruding in the second direction.

In some embodiments of the present disclosure, the third corner has an edge rounded with a third radius, and the fourth corner has an edge rounded with a fourth radius, the third radius is greater than the fourth radius.

In some embodiments of the present disclosure, the third corner has an edge substantially parallel to the second direction, and the fourth corner has an edge rounded with a fourth radius.

In some embodiments of the present disclosure, the fourth radius is greater than or equal to 3 um.

In some embodiments of the present disclosure, the first direction is substantially perpendicular to the second direction, each of the first light emitting zones has a shape obtained by chamfering each of the four corners of a square, two of the four corners are opposite to each other in the first direction and are rounded or flattened, the other two of the four corners are opposite to each other in the second direction and are rounded, each of the second light emitting zones has a shape obtained by chamfering each of the four corners of a square, two of the four corners are opposite to each other in the first direction and are rounded or flattened, the other two of the four corners are opposite to each other in the second direction and are rounded, and each of the third light emitting zones has a shape obtained by chamfering each of the four corners of a rectangle, and the four corners are rounded or flattened, wherein each third light emitting zone is oriented such that a long side of the rectangle is opposite to a side of the corresponding first light emitting zone directly adjacent to the third light emitting zone and is substantially parallel to the side of the corresponding first light emitting zone, and a short side of the rectangle is opposite to a side of the corresponding second light emitting zone directly adjacent to the third light emitting zone and substantially parallel to the side of the corresponding second light emitting zone.

In some embodiments of the present disclosure, the first direction is a direction along which evaporation sources are arranged in an evaporation process of the display panel, and the second direction is a direction along which the evaporation sources moves in the evaporation process.

According to a second aspect of the present disclosure, there is provided a method of manufacturing a display panel, including patterning a first conductive layer to form a plurality of first electrodes, wherein the first electrodes are arranged in an array in a first direction and a second direction crossing the first direction; forming a pixel defining layer on the patterned first conductive layer; patterning the pixel defining layer to form a plurality of openings respectively exposing the plurality of first electrodes, wherein each opening exposes at least a part of the corresponding first electrode, and a first plurality of first electrodes among the plurality of first electrodes are respectively exposed by a first plurality of openings among the plurality of openings, a second plurality of first electrodes among the plurality of first electrodes are respectively exposed by a second plurality of openings among the plurality of openings, and a third plurality of first electrodes in the plurality of first electrodes are respectively exposed by a third plurality of openings among the plurality of openings; forming a plurality of first light emitting layers respectively covering the first plurality of openings, a plurality of second light emitting layers respectively covering the second plurality of openings, and a plurality of third light emitting layers respectively covering the third plurality of openings, wherein the first plurality of openings define respective first light emitting zones of the plurality of first light emitting layers; and forming a second conductive layer on the first light emitting layers, the second light emitting layers and the third light emitting layers, wherein each first light emitting layer includes a shaded region, the shaded region is a peripheral region of the first light emitting layer and has a thickness less than a thickness threshold, and each of the first plurality of openings has a reduced size in the first direction, so that the corresponding first light emitting zone defined by the opening has a first misalignment tolerance range in the first direction, and has a second misalignment tolerance range in the second direction, the corresponding first light emitting zone is allowed to shift in the first direction within the first misalignment tolerance range without overlapping with the shaded region of the corresponding first light emitting layer, the corresponding first light emitting zone is allowed to shifted in the second direction within the second misalignment tolerance range without overlapping with the shaded region of the corresponding first light emitting layer, wherein the first misalignment tolerance range is substantially equal to the second misalignment tolerance range.

In some embodiments of the present disclosure, the thickness threshold of the shaded region of each first light emitting layer is a standard thickness of the first light emitting layer multiplied by a percentage, and the standard thickness is a difference between a maximum thickness and a minimum thickness of the first light emitting layer.

In some embodiments of the present disclosure, the percentage is 98%.

In some embodiments of the present disclosure, forming the first light emitting layers, the second light emitting layers, and the third light emitting layers comprises respectively evaporating a first light emitting material, a second light emitting material, and a third light emitting material by an evaporation process, the first direction is a direction along which evaporation sources are arranged in the evaporation process, and the second direction is the direction along which the evaporation sources move in the evaporation process.

These and other aspects of the present disclosure will be clearly understood from the embodiments described below, and will be described with reference to the embodiments below.

BRIEF DESCRIPTION OF THE DRAWINGS

In the following description of exemplary embodiments in conjunction with the accompanying drawings, more details, features and advantages of the present disclosure are disclosed. In the accompanying drawings.

DETAILED DESCRIPTIONS

Figure 1A:
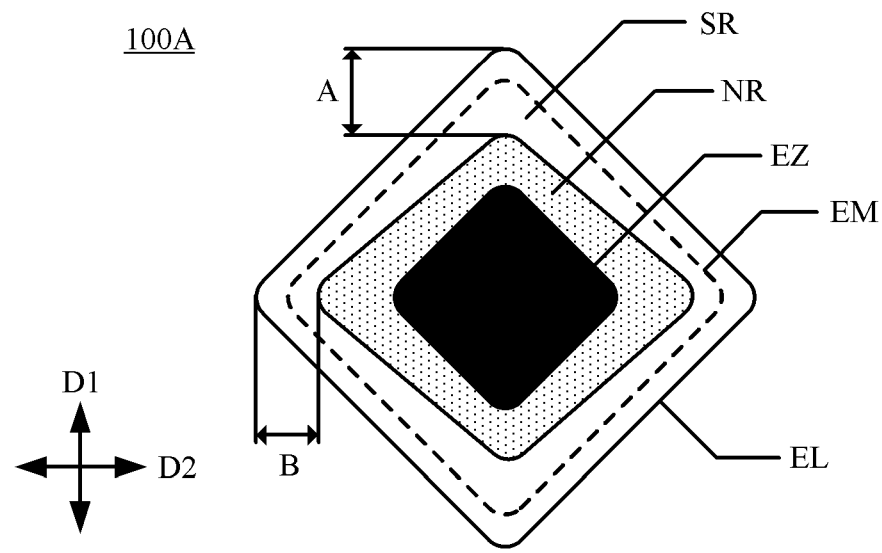
FIG. 1A schematically shows a plan view of a typical sub-pixel region in the related art.

It will be understood that although the terms "first", "second", "third", etc. may be used herein to describe various elements, components, regions, layers and/or sections, these elements, components, regions, layers and/or sections should not be restricted by these terms. These terms are only used to distinguish one element, component, region, layer or section from another region, layer or section. Therefore, the first element, component, region, layer or section discussed below may be referred to as a second element, component, region, layer or section without departing from the teachings of the present disclosure.

Terms about relative spaces such as "row", "column", "below", "under", "relatively lower", "on", "above", "relatively higher", etc. may be used herein to describe the relationship between one element or feature and another element or feature(s) as illustrated in the drawings for ease of description. It will be understood that these terms about relative spaces are intended to cover different orientations of the device in use or operation in addition to the orientation depicted in the drawings. For example, if the device in the drawing is turned over, then elements described as "under other elements or features" or "below other elements or features" or "lower than other elements or features" will be oriented as "above other elements or features". Thus, the exemplary terms "below" and "under" can encompass both an orientation of above and below. Terms such as "before" or "ahead" and "after" or "followed by" can similarly be used, for example, to indicate the order in which light passes through the elements. The device can be oriented in other ways (rotated by 90 degrees or in other orientations) and the spatial relative descriptors used in the descriptions are interpreted accordingly. In addition, it will also be understood that when a layer is referred to as "between two layers," it can be the only layer between the two layers, or one or more intervening layers may also be present.

The terms used herein are only for the purpose of describing specific embodiments and are not intended to limit the present disclosure. As used herein, the singular forms "a," "an," and "the" are intended to also include the plural, unless the context clearly dictates otherwise. It will be further understood that the terms "including" and/or "comprising" when used in this specification designate the existence of the described features, steps, operations, elements and/or components, but do not exclude the existence of one or more other features, steps, operations, elements, components, and/or groups thereof or addition of one or more other features, steps, operations, elements, components, and/or groups thereof. As used herein, the term "and/or" includes any and all combinations of one or more of the associated listed items.

It will be understood that when an element or layer is referred to as being "on another element or layer," "connected to another element or layer," "coupled to another element or layer," or "adjacent to another element or layer", it may be directly on another element or layer, directly connected to another element or layer, directly coupled to another element or layer, or directly adjacent to another element or layer, or intervening elements or layers may be present. On the contrary, when an element is referred to as being "directly on another element or layer", "directly connected to another element or layer", "directly coupled to another element or layer", "directly adjacent to another element or layer", no intermediate elements or layers exist. However, "on" or "directly on" should not be interpreted as requiring a layer to completely cover the underlying layer in any case.

The embodiments of the present disclosure are described herein with reference to schematic illustrations (and intermediate structures) of ideal embodiments of the present disclosure. Because of this, a change to the illustrated shape should be expected, for example, as a result of manufacturing technology and/or tolerances. Therefore, the embodiments of the present disclosure should not be interpreted as being limited to the specific shape of the regions illustrated herein, but should include, for example, shape deviations due to manufacturing. Therefore, the regions illustrated in the drawings are schematic in nature, and their shapes are not intended to illustrate the actual shapes of the regions of the device and are not intended to limit the scope of the present disclosure.

Unless otherwise defined, all terms (including technical and scientific terms) used herein have the same meaning as commonly understood by those of ordinary skill in the art to which this disclosure belongs. It will be further understood that terms such as those defined in commonly used dictionaries should be interpreted as having meanings consistent with their meanings in the relevant field and/or the context of this specification, and will not be idealized or overly interpreted in a formal sense, unless explicitly defined as such in this article.

FIG. 1A is a plan view schematically showing a sub-pixel region 100A in the related art. The sub-pixel region includes a normal region NR and a shaded region SR.

In the evaporation process, the light emitting materials (evaporation sources) are arranged along the first direction D1 and evaporated, and the evaporation sources move along the second direction D2 that crosses (for example, substantially perpendicular to) the first direction D1 to sweep over a mask such as a fine metal mask (FMM). In this process, the evaporated light emitting material passes through the openings EM of the mask and is deposited to form the light emitting layer EL. Due to the shadow effect of the mask, when viewed from above, a shaded region SR is formed on the inner and outer sides of the edge of the opening EM.

As shown in FIG. 1A, the light emitting layer EL in the sub-pixel region 100A includes a normal region NR which is in the center and has a normal thickness and a shaded region SR which is in the periphery and has a thickness smaller than that of the normal region NR. The shaded region SR may be defined as a peripheral region of the light emitting layer EL, the thickness of which is less than a thickness threshold. Generally speaking, the thickness threshold is equal to the standard thickness of the light emitting layer EL multiplied by a percentage, such as 98%, where the standard thickness is the difference between the maximum thickness and the minimum thickness of the light emitting layer EL. The percentage can be selected as 98% because the fluctuation range of the film thickness in the evaporation process is generally from 0 to 2%. It will be understood that this percentage can vary with process parameters and is therefore not limited to 98%. In addition, for the shaded regions in different light emitting layers, the thickness thresholds may be the same, or there may be some smaller differences, because the size and thickness of the shaded region usually mainly depend on process parameters such as the vapor-deposited material, the size of the opening, and the distance between the mask and the substrate. For the same display panel, except for the material difference, other process parameters are similar, so the thickness threshold of the shaded region will not have a big difference.

The opening of the pixel defining layer (not shown) defines the light emitting zone EZ of the light emitting layer EL. Specifically, the outline of the light emitting zone EZ can be considered to roughly coincide with the boundary of the opening of the pixel defining layer. In the example of FIG. 1A, the light emitting region EZ is formed in the center of the light emitting layer EL, and includes only a part of the normal region NR.

In practice, the opening of the pixel defining layer (PDL) may be formed to deviate from its normal position, so that the light emitting zone includes a part of the shaded region in addition to the part of the normal region. Due to the smaller thickness of the shaded region, the resulting sub-pixels may suffer from color missing or color mixing. Therefore, the size of the shaded region may affect the process margin. The process margin allows the opening of the PDL to be shifted without affecting the display performance of the sub-pixels. As the resolution of the display panel increases and thus the gap between the various openings of the PDL decreases, the shaded region increasingly affects the yield of the display panel made of the organic light emitting diodes.

Figure 1B:
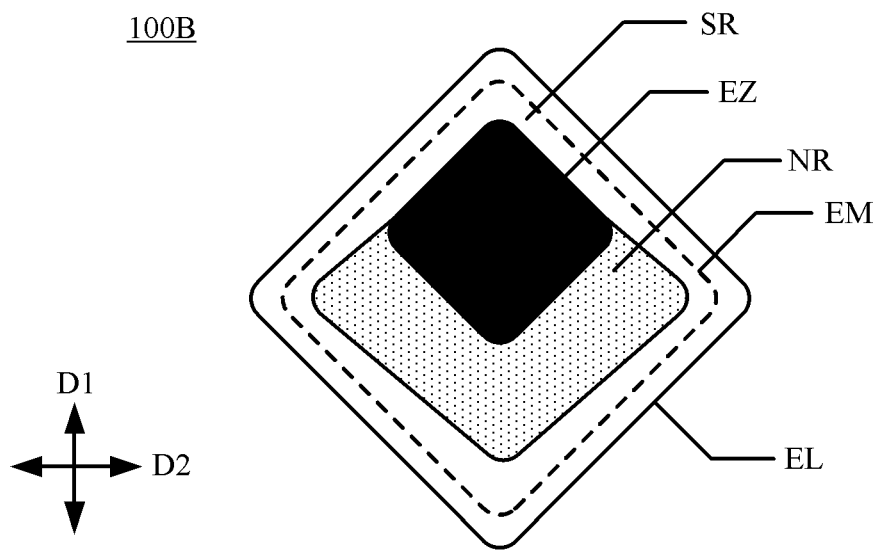
FIG. 1B schematically shows a plan view of the sub-pixel region in which the light emitting zone is shifted in the first direction compared with the sub-pixel region of FIG. 1A.

FIG. 1B is a plan view schematically showing the sub-pixel region 100B in which the light emitting zone EZ is shifted.

Referring to FIG. 1B, in the sub-pixel region 100B, the light emitting zone EZ is shifted in the first direction D1. This may be caused by, for example, the unintentional shift of the light mask when patterning the opening of the pixel defining layer. As a result, the light emitting zone EZ includes both a part of the shaded region SR and a part of the normal region NR. As mentioned earlier, this easily leads to color missing or color mixing of the sub-pixel, and therefore should be avoided.

Referring back to FIG. 1A, the inventors have found that the size A of the shaded region SR in the first direction D1 is always greater than the size B of the shaded region SR in the second direction D2 by a certain value, for example, 1.5 micrometers (um). This is a systematic error introduced by the evaporation process itself. Due to the existence of this systematic error, the light emitting zone EZ will have different process margins in the first direction D1 and the second direction D2, wherein the process margin in the first direction D1 is smaller than the process margin in the second direction D2. The small process margin in the first direction D1 has become a bottleneck problem in improving the yield of the display panel.

Figure 2:
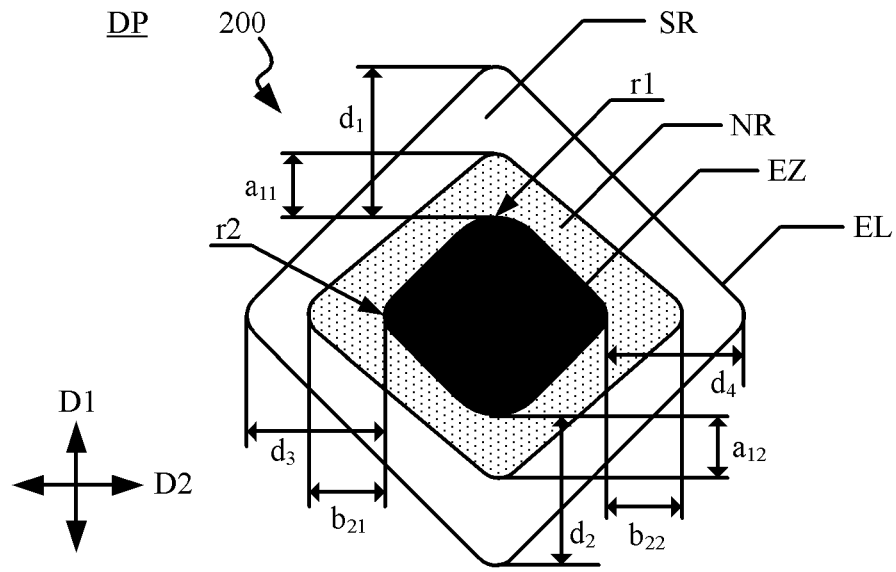
FIG. 2 schematically shows a plan view of a sub-pixel region of a display panel according to an embodiment of the present disclosure.

FIG. 2 is a plan view schematically showing a sub-pixel region 200 of the display panel DP according to an embodiment of the present disclosure.

Referring to FIG. 2, the light emitting layer EL in the sub-pixel region 200 includes a normal region NR and a shaded region SR. The light emitting zone EZ defined by the opening of the pixel defining layer (not shown) is formed in the normal region NR. It will be understood that the display panel DP includes a plurality of such sub-pixel regions 200, although only one of them is shown for clarity of illustration.

The light emitting zone EZ (or equivalently, the opening in the pixel defining layer) has a reduced size in the first direction D1. In this example, the light emitting zone EZ has a substantially square shape. Two corners (specifically, an upper corner and a lower corner) of the square protrude in the first direction D1, and the other two corners (specifically, one left corner and one right corner) of the square protrude in the second direction D2. As used herein, the phrase "the light emitting zone has a corner protruding in a direction" means that the corner is a region of the light emitting layer that is more protruding in this direction with respect to other regions of the light emitting layer.

As shown in FIG. 2, the upper corner is rounded with a first radius r1, and the left corner is rounded with a second radius r2, where the first radius r1 is greater than the second radius r2. Alternatively or additionally, the lower corner and the right corner are rounded with the first radius r1 and the second radius r2, respectively. As a result, the light emitting zone EZ is substantially square and has a first size in the first direction D1 and a second size in the second direction D2, wherein the second size is larger than the first size. In other words, the sum of a distance d1 between the upper boundary of the light emitting zone EZ and the upper boundary of the light emitting layer EL and a distance d2 between the lower boundary of the light emitting zone EZ and the lower boundary of the light emitting layer EL is greater than the sum of a distance d3 between the left boundary of the light emitting zone EZ and the left boundary of the light emitting layer EL and a distance d4 between the right boundary of the light emitting zone EZ and the right boundary of the light emitting layer EL.

In this way, the light emitting zone EZ has such a size in the first direction D1 that the light emitting zone EZ has a first misalignment tolerance range in the first direction D1, and the light emitting zone EZ is allowed to shift in the first direction D1 within the first misalignment tolerance range without overlapping the shaded region SR, and has a second misalignment tolerance range in the second direction D2, the light emitting zone EZ is allowed to shift in the second direction D2 within the second misalignment tolerance range without overlapping the shaded region SR. The phrase "A and B do not overlap each other" as used herein means that there is no intersection between the footprint of A and the footprint of B. The first misalignment tolerance range is approximately equal to the sum of the upper margin an and the lower margin $a_{12}$, and the second misalignment tolerance range is approximately equal to the sum of the left margin $b_{11}$ and the right margin $b_{12}$.

Specifically, the first misalignment tolerance range is substantially equal to the second misalignment tolerance range. The term "substantially" as used herein is intended to cover deviations from ideal conditions introduced due to, for example, a manufacturing process. More specifically, the absolute value of the difference between the first misalignment tolerance range and the second misalignment tolerance range may be smaller than the systematic error introduced by the evaporation process, such as 1.5 um. This increases the process margin in the first direction D1, thereby helpful in alleviating the bottleneck problem of increasing the yield of the display panel caused by the small process margin in the first direction D1.

It will be understood that the shapes of the light emitting layer EL and the light emitting zone EZ shown in FIG. 2 are exemplary, and other embodiments are possible. For example, only one of the upper and lower corners is chamfered, and/or only one of the left and right corners is chamfered. In other embodiments, the sub-pixel region 200 may include the light emitting layer EL and the light emitting zone EZ having any other suitable shapes.

Figure 3:
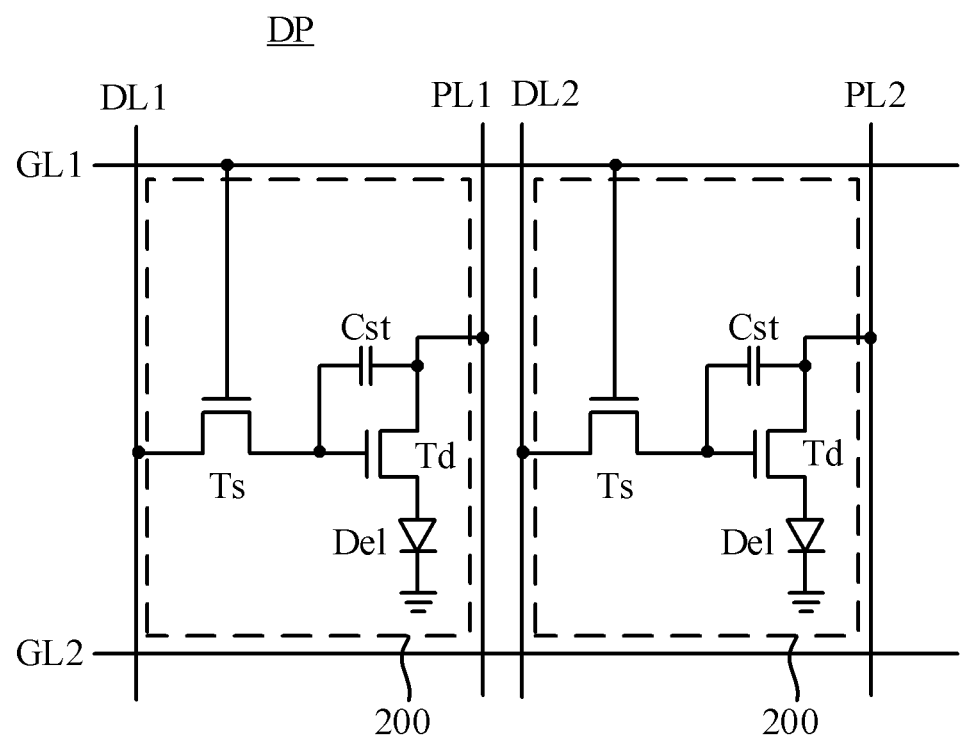
FIG. 3 schematically shows a circuit diagram of an example pixel circuit of the display panel of FIG. 2.

FIG. 3 schematically shows a circuit diagram of an example pixel circuit of the display panel DP of FIG. 2.

Referring to FIG. 3, the display panel DP includes first gate line GL1 and second gate line GL2, first data line DL1 and second data line DL2, and first power line PL1 and second power line PL2. The region surrounded by the first gate line GL1, the second gate line GL2, the first data line DL1, and the first power line PL1 may be defined as the sub-pixel region 200, and the region surrounded by the first gate line GL1, the second gate line GL2, the second data line DL2 and the second power line PL2 may be defined as another sub-pixel region 200.

Each sub-pixel region 200 includes a switching transistor Ts, a driving transistor Td, a storage capacitor Cst, and a light emitting diode Del. This is a typical pixel circuit with two transistors and one capacitor ("2T1C"). It will be understood that the pixel circuit shown in FIG. 3 is only exemplary and schematic. In other embodiments, the sub-pixel region 200 may be provided with other forms of pixel circuits. For example, the second power line PL2 is omitted, and the driving transistor Td in the right sub-pixel region 200 is connected to the first power line PL1. That is, the left and right sub-pixel regions 200 share the first power line PL1. Any other suitable pixel circuit can also be used.

Figure 4:
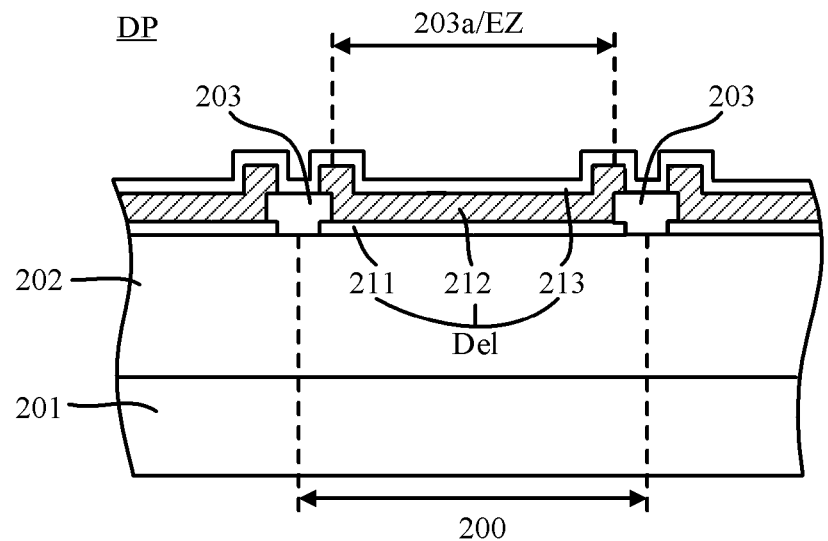
FIG. 4 schematically shows a cross-sectional view of the display panel of FIG. 2.

FIG. 4 schematically shows a cross-sectional view of the display panel DP of FIG. 2. For the convenience of description, it is assumed that the pixel circuit shown in FIG. 3 is used in each sub-pixel region 200.

Referring to FIG. 4, the display panel DP includes a base substrate 201 on which a driving transistor Td, a switching transistor Ts, and a storage capacitor Cst (not shown) are formed in each sub-pixel region. Although not shown, each of the driving transistor Td and the switching transistor Ts includes a gate electrode, a semiconductor layer, a source electrode, and a drain electrode. For example, the driving transistor Td of a top gate type includes a semiconductor layer made of polysilicon, a gate insulating layer on the semiconductor layer, a gate electrode on the gate insulating layer, and source and drain electrodes above the gate electrode. The center of the semiconductor layer serves as a channel, and impurities are doped to both ends of the semiconductor layer. The source and drain electrodes contact both ends of the semiconductor layer.

A passivation layer 202 is formed on the entire surface of the base substrate 201 to cover the driving transistor Td, the switching transistor Ts, and the storage capacitor Cst (not shown). The passivation layer 202 may be formed of an inorganic insulating material (for example, silicon oxide or silicon nitride) or an organic insulating material (for example, benzocyclobutene or acrylic resin).

The first electrode 211 is formed on the passivation layer 202. The first electrode 211 serves as the anode of the light emitting diode Del, and is connected to the drain electrode of the driving transistor Td (not shown). It will be understood that although only one first electrode 211 is marked in FIG. 4, there are multiple first electrodes formed on the passivation layer 202. These first electrodes belong to respective sub-pixel regions, and may be formed by patterning a first conductive layer (for example, indium tin oxide (ITO)).

The pixel defining layer 203 is formed at the boundary of the first electrode 211 in order to delimit different sub-pixel regions 200. The pixel defining layer 203 includes an opening 203a that exposes at least a part of the first electrode 211. The position, size, and shape of the opening 203a determine the size and shape of the exposed portion of the first electrode 211, and thus define the position, size, and shape of the light emitting zone EZ of the sub-pixel region 200. It will be understood that although only one opening 203a is marked in FIG. 4, there are a plurality of openings formed in the corresponding sub-pixel region among the sub-pixel regions to expose the corresponding first electrode. The pixel defining layer 203 may be formed of an inorganic insulating material (for example, silicon oxide or silicon nitride) or an organic insulating material (for example, benzocyclobutene or acrylic resin).

The light emitting layer 212 is formed on the exposed portion of the first electrode 211 and covers the opening 203a. The area of the light emitting layer 212 is generally larger than the area of the opening 203a, so that the orthographic projection of the opening 203a on the base substrate 201 typically falls within the orthographic projection of the light emitting layer 212 on the base substrate 201. Alternatively, in some embodiments, the light emitting layer 212 may only fill the opening 203a without exceeding the opening 203a. The light emitting layer 212 may include an electron injection layer (EIL), an emission material layer (EML), and a hole injection layer (HIL) to improve emission efficiency. It will be understood that although only one light emitting layer 212 is marked in FIG. 4, there are multiple light emitting layers formed on the corresponding first electrode of the first electrodes, as shown by the slanted regions in FIG. 4.

The second electrode 213 is integrally formed on each light emitting layer 212. The second electrode 213 serves as a cathode of the light emitting diode Del, and may be formed of a second conductive layer (for example, aluminum).

The first electrode 211, the light emitting layer 212, and the second electrode 213 form a light emitting diode Del. When the light emitting diode Del is excited, a region of the light emitting layer 212 that overlaps the opening 203a can effectively emit light, and may be defined as the light emitting zone EZ. As shown in FIG. 4, the outline of the light emitting zone EZ is determined by the shape of the opening 203a.

Figure 5:
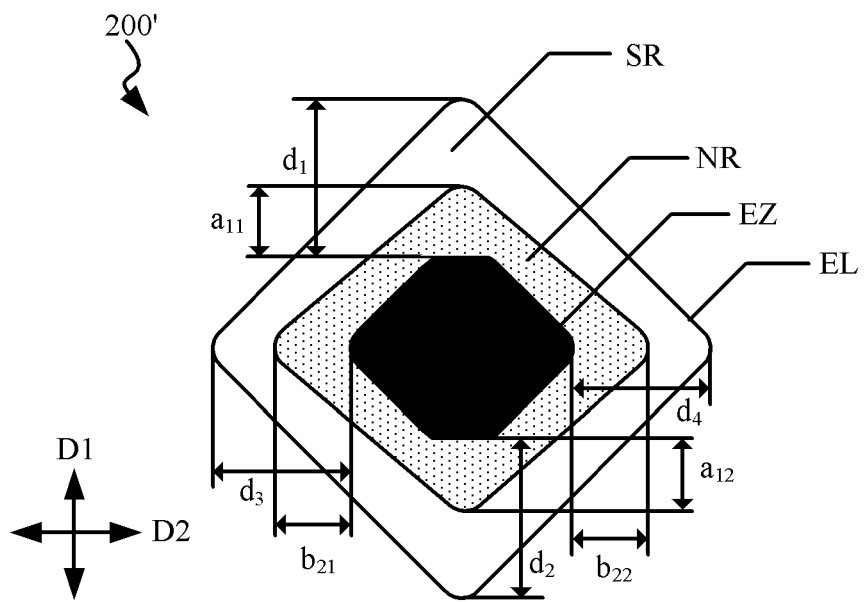
FIG. 5 schematically shows a plan view of a modification of the sub-pixel region of FIG. 2.

FIG. 5 schematically shows a plan view of a modification 200' of the sub-pixel region 200 of FIG. 2.

Referring to FIG. 5, the light emitting layer EL in the sub-pixel region 200' also includes a normal region NR and a shaded region SR, and the light emitting zone EZ is formed in the normal region NR.

The light emitting zone EZ (or equivalently, the opening in the pixel defining layer) also has a reduced size in the first direction D1. Specifically, the left and right corners of the light emitting zone EZ are designed to be the same as those in FIG. 2, that is, rounded with a smaller second radius r2, and its upper corners are flattened so that the upper corner has an edge substantially parallel to the second direction D2. Alternatively or additionally, the lower corner of the light emitting zone EZ may be flattened so that the lower corner has an edge substantially parallel to the second direction D2. As a result, the substantially square light emitting zone EZ has a first size in the first direction D1 and a second size in the second direction D2, wherein the second size is larger than the first size. In other words, the sum of the distance d1 between the upper boundary of the light emitting zone EZ and the upper boundary of the light emitting layer EL and the distance d2 between the lower boundary of the light emitting zone EZ and the lower boundary of the light emitting layer EL is greater than the sum of the distance d3 between the left boundary of the light emitting zone EZ and the left boundary of the light emitting layer EL and the distance d4 between the right boundary of the light emitting zone EZ and the right boundary of the light emitting layer EL.

In this way, the light emitting zone EZ has such a size that the light emitting zone EZ has a first misalignment tolerance range in the first direction D1, which is approximately equal to the sum of the upper margin $a_{11}$ and the lower margin $a_{12}$, and has a second misalignment tolerance range in the second direction D2, which is approximately equal to the sum of the left margin $b_{21}$ and the right margin $b_{22}$.

Specifically, the first misalignment tolerance range is substantially equal to the second misalignment tolerance range. More specifically, the absolute value of the difference between the first misalignment tolerance range and the second misalignment tolerance range may be smaller than the systematic error introduced by the evaporation process, such as 1.5 um.

It will be understood that the shapes of the light emitting layer EL and the light emitting zone EZ shown in FIG. 5 are exemplary, and other embodiments are possible. For example, only one of the upper and lower corners is chamfered, and/or only one of the left and right corners is chamfered. In other embodiments, the sub-pixel region 200' may include the light emitting layer EL and the light emitting zone EZ having any other suitable shapes. It will also be understood that although the flattened upper and lower corners of the light emitting zone EZ are shown in FIG. 5 as having flat edges substantially parallel to the second direction D2, in practice these flat edges may be rounded at their ends due to process reasons. This still falls within the scope of this disclosure.

Figure 6:
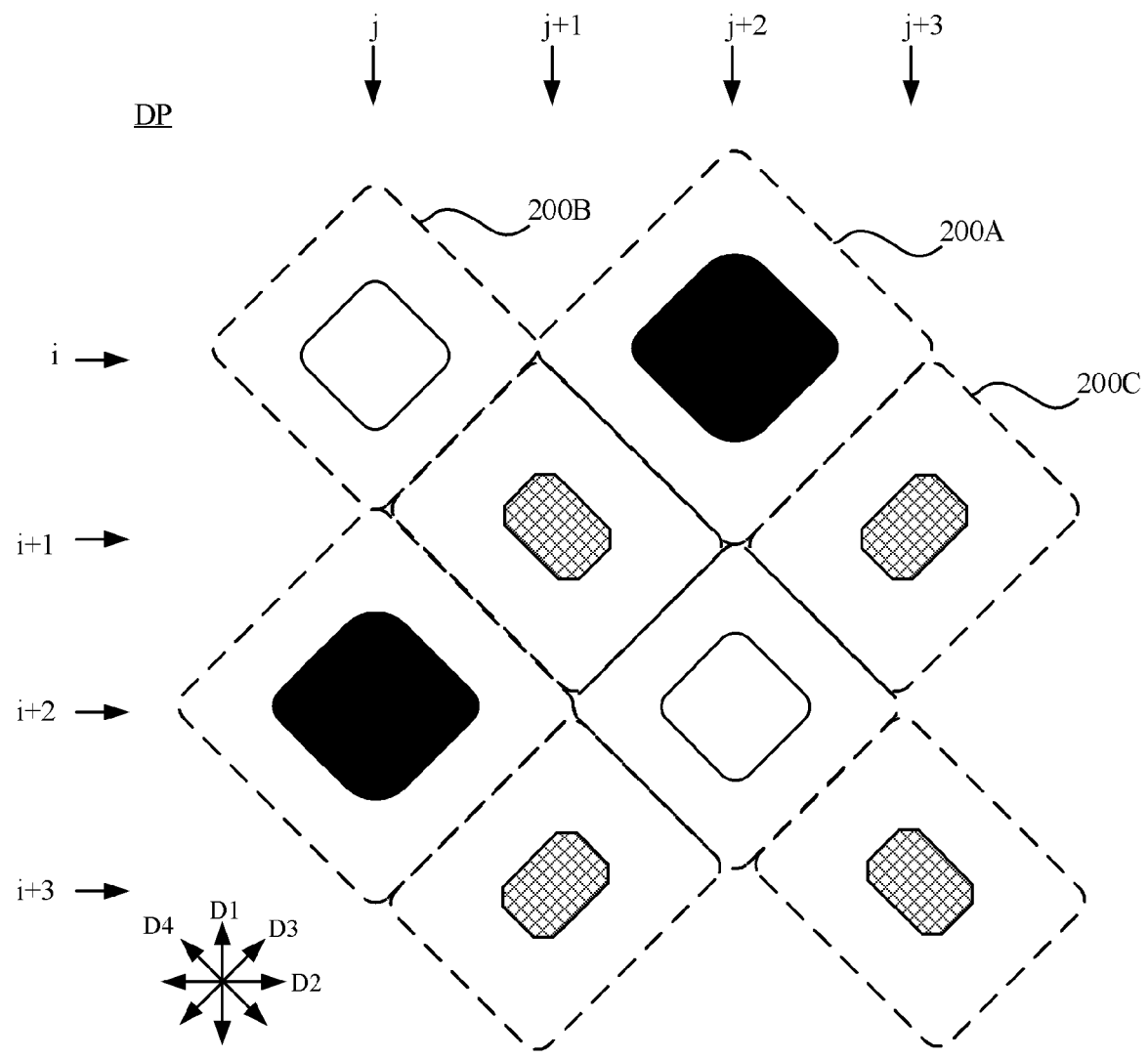
FIG. 6 schematically shows a plan view of a plurality of sub-pixel regions of a display panel according to an embodiment of the present disclosure.

FIG. 6 schematically shows a plan view of a plurality of sub-pixel regions of the display panel DP according to an embodiment of the present disclosure.

Referring to FIG. 6, each first sub-pixel regions 200A has the configuration described above with respect to FIG. 2. Specifically, the upper and/or lower corners of their light emitting zone are rounded with a larger first radius, and the left and/or right corners of their light emitting zone are rounded with a smaller second radius. As a result, each first light emitting zone has a shape obtained by chamfering each of the four corners of a square, two of the four corners are opposite to each other in the first direction D1 and are rounded, the other two of the four corners are opposite to each other in the second direction D2 and are rounded. In this example, the second direction D2 is substantially perpendicular to the first direction D1.

The light emitting zone of each second sub-pixel region 200B is not modified in this example. Specifically, each second light emitting zone has a shape obtained by chamfering each of the four corners of a square, two of the four corners are opposite to each other in the first direction D1 and are rounded, the other two of the four corners are opposite to each other in the second direction D2 and are rounded (with the same radius as the two corners in the first direction D1).

The light emitting zone of each third sub-pixel region 200C is not modified in this example. Specifically, each third light emitting zone has a shape obtained by chamfering each of the four corners of a rectangle, and the four corners are all flattened. Each third light emitting zone is oriented such that a long side of the rectangle is opposite to a side of the corresponding first light emitting zone directly adjacent to the third light emitting zone and is substantially parallel to the side of the first light emitting zone. A short side of the rectangle is opposite to a side of the corresponding second light emitting zone directly adjacent to the third light emitting zone and substantially parallel to the side of the corresponding second light emitting zone.

The two first sub-pixel regions 200A (or similarly, its light emitting layer), the two second sub-pixel regions 200B (or similarly, its light emitting layer), and the four third sub-pixel regions 200C (or similarly, its light emitting layer) shown in FIG. 6 form a repeating unit. The two first sub-pixel regions are arranged in the ith row and (j+2)th column, and the (i+2)th row and jth column, respectively. The two second sub-pixel regions are arranged in the ith row and jth column, and the (i+2)th row and (j+2)th column, respectively. The four third sub-pixel regions are respectively arranged in the (i+1)th row and (j+1)th column, (i+1)th row and (j+3)th column, (i+3)th row and (j+1)th column, and (i+3)th rows and (j+3)th columns (i and j are integers greater than or equal to 1). Here, the terms "row" and "column" are used with reference to the first direction D1 and the second direction D2 in FIG. 6, that is, the direction parallel to the first direction D1 is called the row direction, and the direction parallel to the second direction D2 is called the column direction.

A plurality of such repeating units are repeatedly arranged across the entire display panel DP in the first direction D1 and the second direction D2. This pixel arrangement is known as the Diamond pixel arrangement, where the first sub-pixel region 200A is a blue sub-pixel, the second sub-pixel region 200B is a red sub-pixel, and the third sub-pixel region 200C is a green sub-pixel.

The area of the light emitting zone of the red sub-pixel, the green sub-pixel, and the blue sub-pixel is determined by the characteristics of the light emitting material. The blue light emitting material has a short service life, so the blue light emitting zone is usually made to have a larger area in order to delay aging. Compared with blue and red, the human eye is more sensitive to green, and therefore the green light emitting zone is usually made to have a smaller area. In some embodiments, the area ratio of the light emitting zone of the red sub-pixel, the light emitting zone of the green sub-pixel, and the light emitting zone of the blue sub-pixel is set as Sr:Sg:Sb=1:(1.2~1.5):(1.4~1.8), where Sr is the area of the red light emitting zone, Sg is the area of the green light emitting zone, and Sb is the area of the blue light emitting zone.

More generally, the display panel DP according to an embodiment of the present disclosure can be described as including a plurality of first group of sub-pixel regions arranged in a third direction D3 and a plurality of second group of sub-pixel regions arranged in the third direction D3. Each of the plurality of first groups includes a plurality of first sub-pixel regions 200A and a plurality of third sub-pixel regions 200C that are alternately arranged, and each of the plurality of second groups includes a plurality of third sub-pixel regions 200C and a plurality of second sub-pixel regions 200B arranged alternately. The plurality of first groups and the plurality of second groups are alternately arranged in a fourth direction D4 crossing (for example, substantially perpendicular to) the third direction D3. The plurality of first groups and the plurality of second groups are arranged so as to form a plurality of third group of sub-pixel regions arranged in the fourth direction D4 and a plurality of fourth group of sub-pixel regions arranged in the fourth direction D4, wherein the plurality of third groups and the plurality of fourth groups are alternately arranged in the third direction. Each of the plurality of third groups includes a plurality of first sub-pixel regions 200A and a plurality of third sub-pixel regions 200C that are alternately arranged, and each of the plurality of fourth groups includes a plurality of third sub-pixel regions 200C and a plurality of second sub-pixel regions 200B that are alternately arranged.

Figure 7:
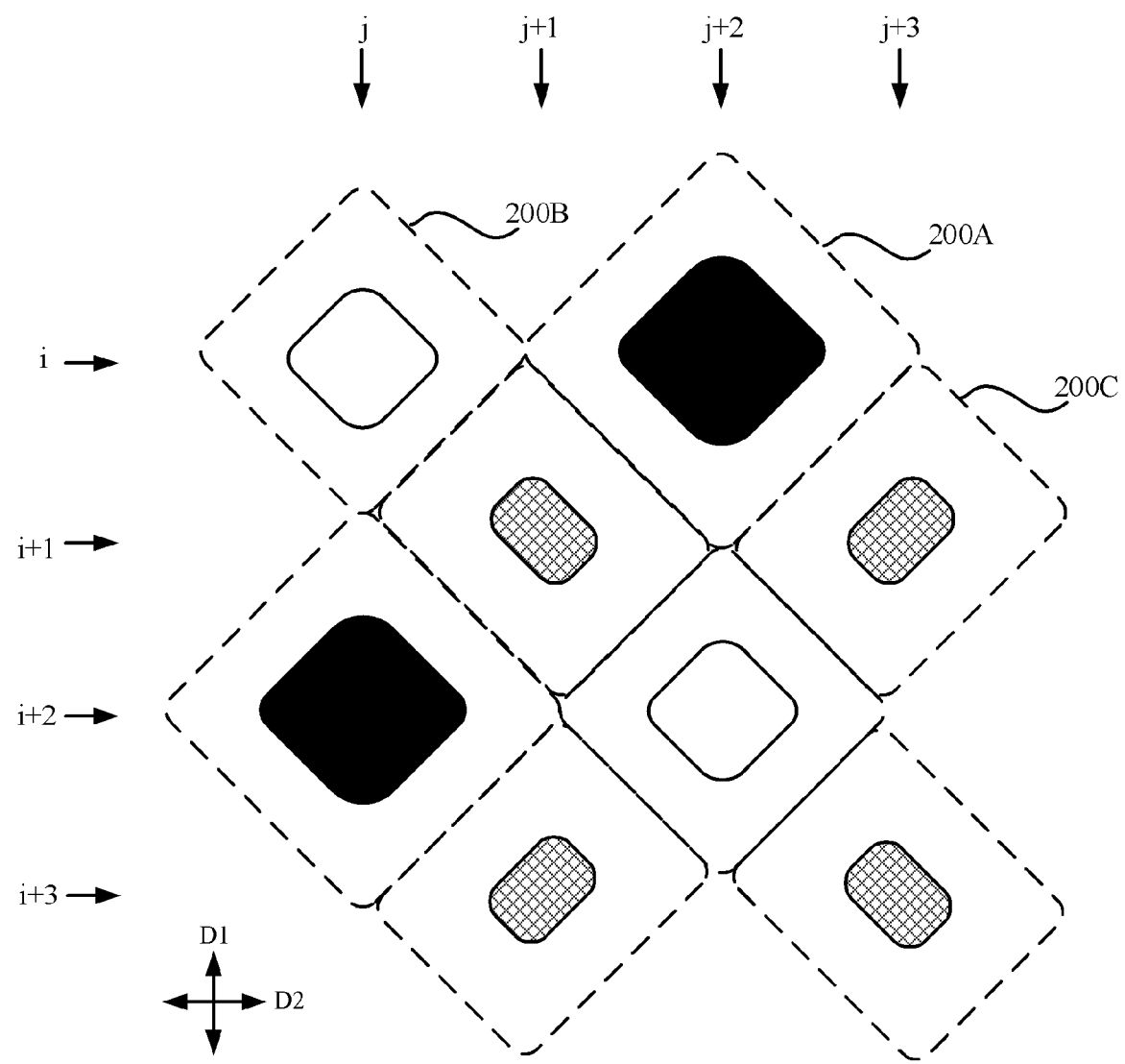
FIG. 7 schematically shows a plan view of multiple sub-pixel regions of a display panel according to an embodiment of the present disclosure.

FIG. 7 schematically shows a modification of the pixel arrangement of FIG. 6.

Referring to FIG. 7, each of the first sub-pixel region 200A and the second sub-pixel region 200B has the configuration described above with respect to FIG. 2. Specifically, the upper and/or lower corners of the light emitting zone of each second sub-pixel region 200B are rounded with a larger third radius, and the left and/or the right corners of the light emitting zone of each second sub-pixel region 200B are rounded with a smaller fourth radius. The radius used to round the light emitting zone of the second sub-pixel region 200B (i.e., the third radius and the fourth radius) may or may not be the same as that (i.e., the first radius and the second radius) used to round the light emitting zone of the first sub-pixel region 200A.

Specifically, each second sub-pixel region 200B has a third misalignment tolerance range in the first direction D1, and has a fourth misalignment tolerance range in the second direction D2 which is substantially equal to the third misalignment tolerance range. More specifically, the absolute value of the difference between the third misalignment tolerance range and the fourth misalignment tolerance range may be smaller than the systematic error introduced by the evaporation process, for example, 1.5 um.

The light emitting zone of each third sub-pixel region 200C is modified to have a shape of a rectangular with rounded corners in this example. Rounded corners are not necessary for these light emitting zones, because they already have a relatively large process margin in the first direction D1.

Figure 8:
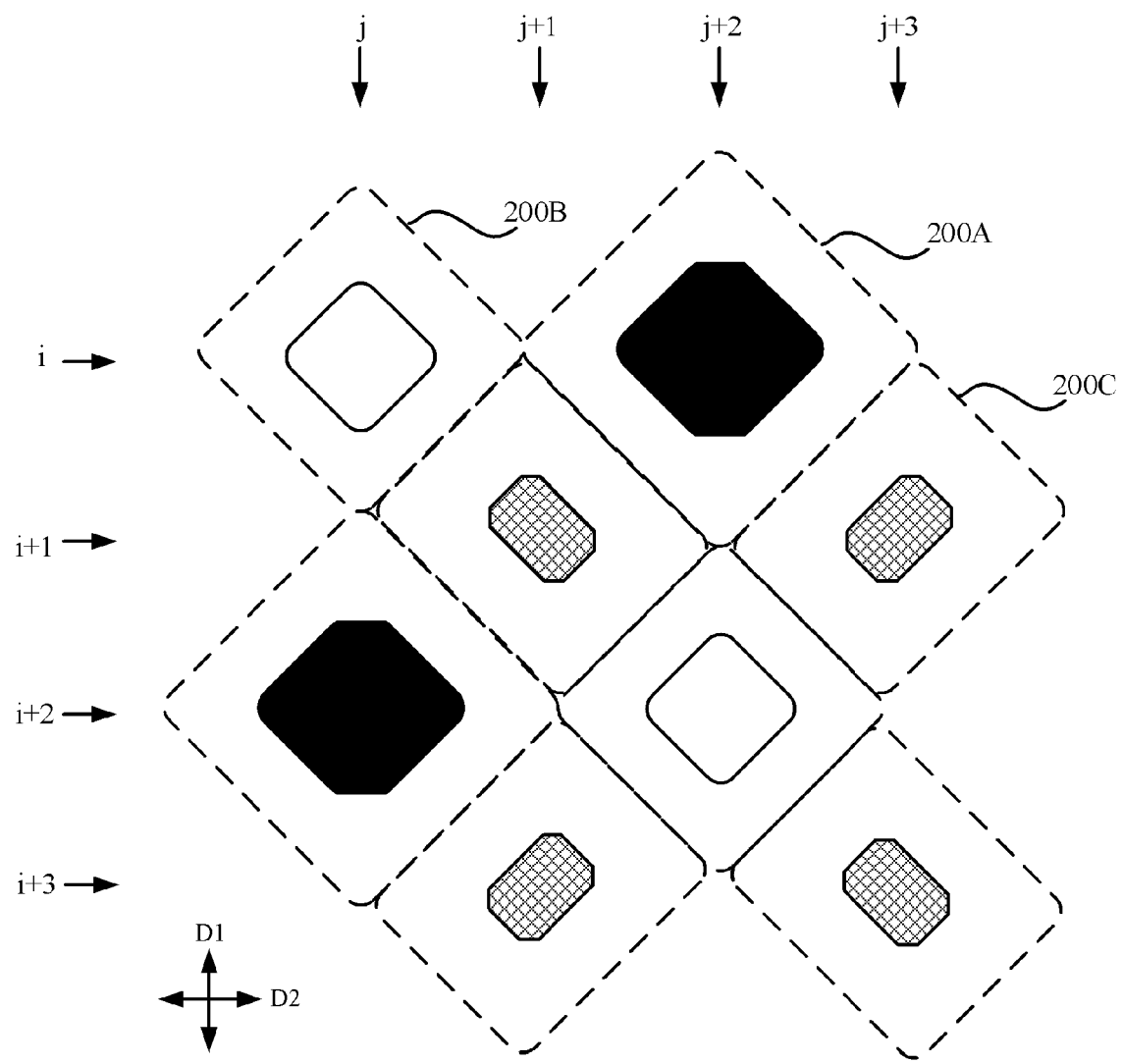
FIG. 8 schematically shows a plan view of multiple sub-pixel regions of a display panel according to an embodiment of the present disclosure.

FIG. 8 schematically shows another modification of the pixel arrangement of FIG. 6.

Referring to FIG. 8, each first sub-pixel regions 200A have the configuration described above with respect to FIG. 5. Specifically, the upper and/or lower corners of their light emitting zones are flattened along the second direction D2, and the left and/or right corners of their light emitting zones are rounded with a smaller second radius. The light emitting regions of each of the second and third sub-pixel regions 200B and 200C are not modified in this example.

Figure 9:
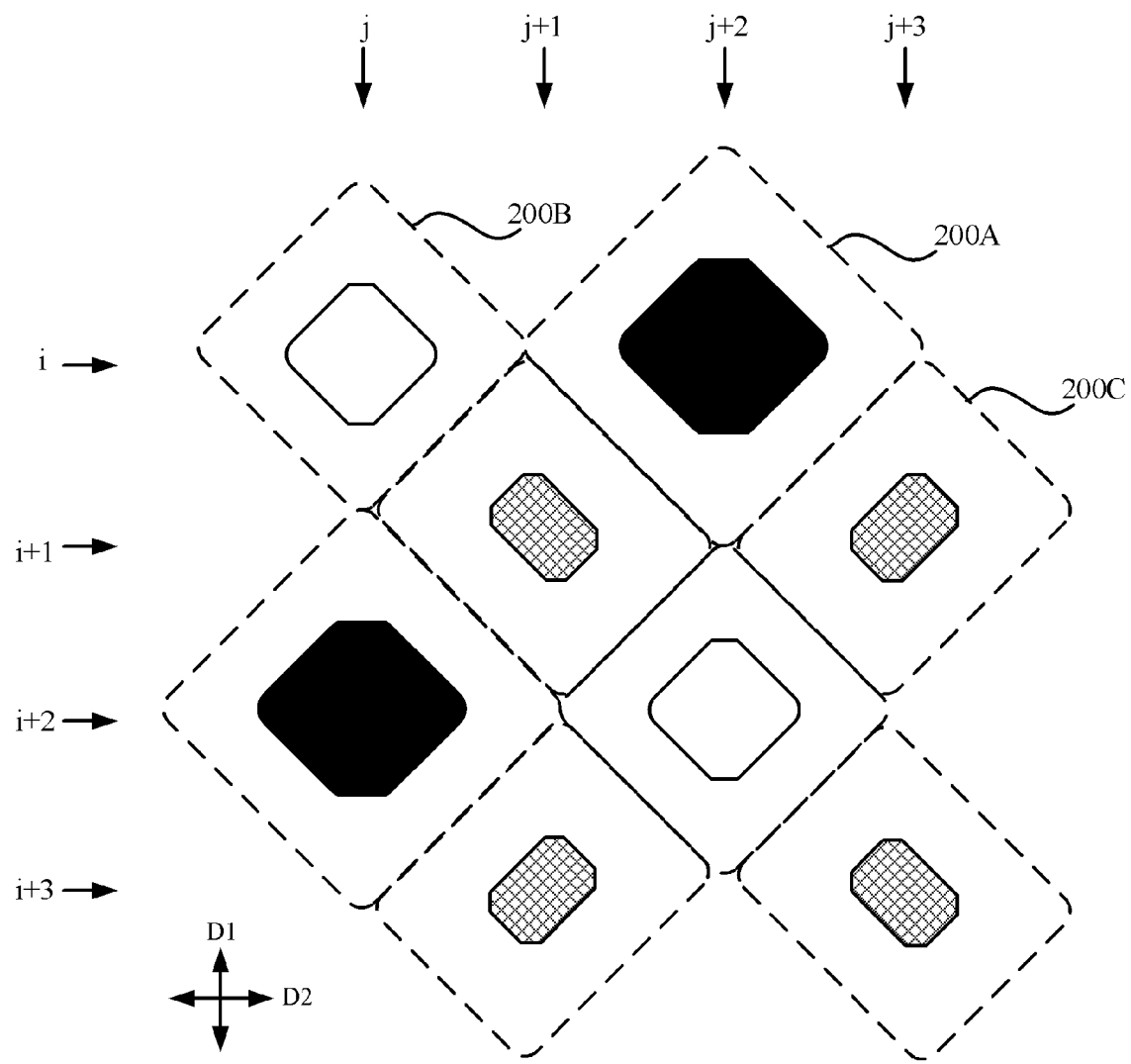
FIG. 9 schematically shows a plan view of multiple sub-pixel regions of a display panel according to an embodiment of the present disclosure.

FIG. 9 schematically shows another modification of the pixel arrangement of FIG. 6.

Referring to FIG. 9, each of the first sub-pixel region 200A and the second sub-pixel region 200B has the configuration described above with respect to FIG. 5. Specifically, the upper corner and/or lower corner of the light emitting zone of each second sub-pixel region 200B is flattened along the second direction D2, and the left corner and/or the right corner of the light emitting zone of each second sub-pixel region 200B are rounded with a smaller fourth radius.

Specifically, each second sub-pixel region 200B has a third misalignment tolerance range in the first direction D1, and has a fourth misalignment tolerance range in the second direction D2 which is substantially equal to the misalignment offset tolerance range. More specifically, the absolute value of the difference between the third misalignment tolerance range and the fourth misalignment tolerance range may be smaller than the systematic error introduced by the evaporation process, for example, 1.5 um. The light emitting zones of the third sub-pixel regions 200C are not modified in this example because they already have a relatively large process margin in the first direction D1.

It will be understood that the pixel arrangement shown in FIG. 6 to FIG. 9 is exemplary, and in other embodiments, the first sub-pixel region 200A, the second sub-pixel region 200B, and the third sub-pixel region 200C may be arranged in other patterns, and their respective light emitting zones may have other shapes than those shown.

In various embodiments, the radius of the rounded corners of the opening of the pixel defining layer is typically greater than or equal to 3 um. The radius in such a range enables the opening formed by means of the photo mask to have a shape sufficiently matching its design value. A radius smaller than 3 um may require a lot of effort without significant gains, because it is possible that the resulting opening may not meet its design goals.

Figure 10:
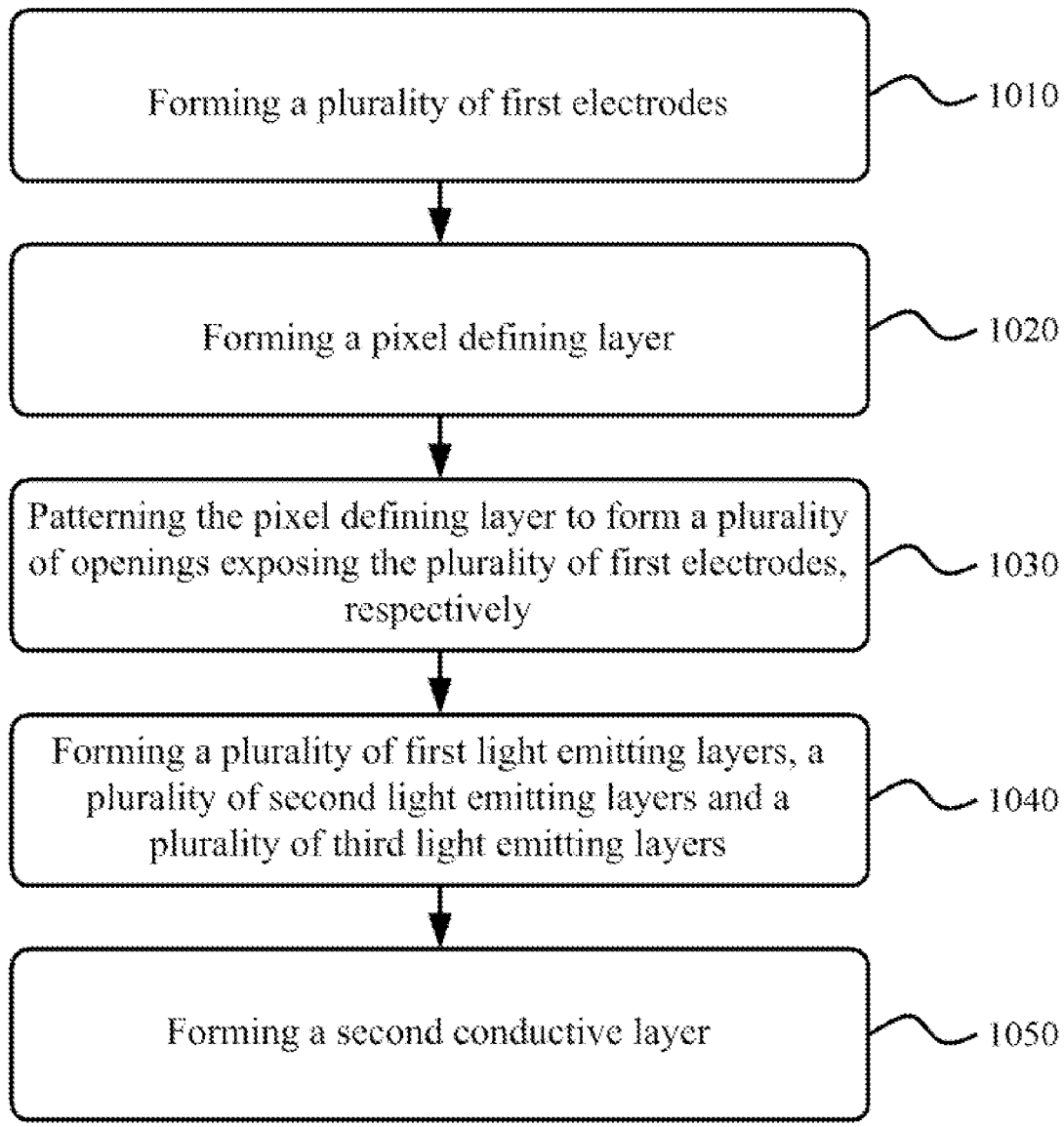
FIG. 10 schematically shows a flowchart of a method of manufacturing a display panel according to an embodiment of the present disclosure.

FIG. 10 schematically shows a flowchart of a method 1000 for manufacturing a display panel according to an embodiment of the present disclosure, and FIG. 11A to FIG. 11F schematically show cross-sectional views of the display panel DP obtained in each step of the method 1000.

Figure 11A:
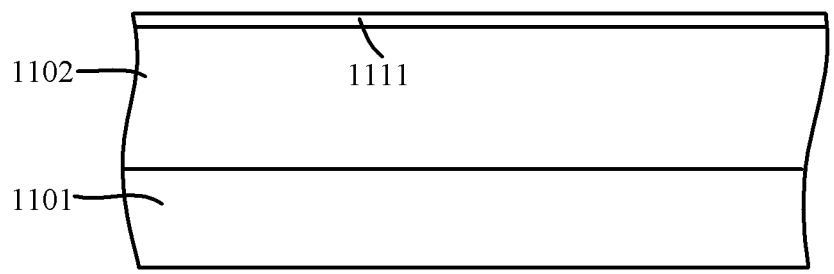
FIG. 11A to FIG. 11F schematically show cross-sectional views of the display panel obtained in the steps of the method of FIG. 10.
Figure 11B:
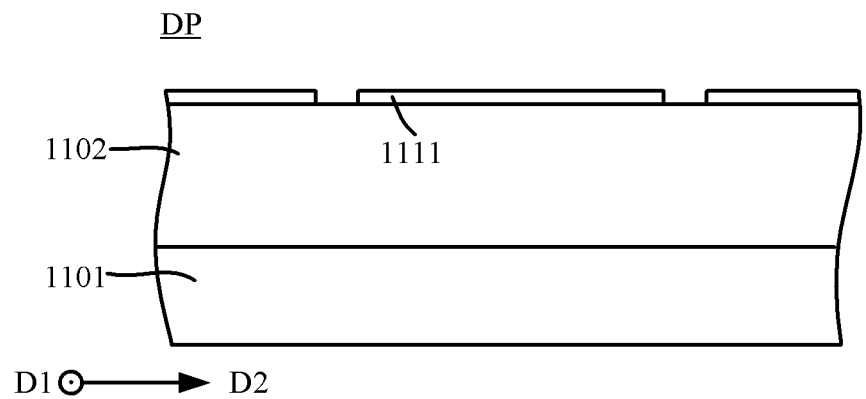

In step 1010, the first conductive layer is patterned to form a plurality of first electrodes. As shown in FIG. 11A, a passivation layer 1102 is formed on the base substrate 1101 to cover the electronic components (for example, the transistors Ts and Td and the capacitor Cst shown in FIG. 3) in the pixel circuit, and the first conductive layer 1111 is formed on the passivation layer 1102. The first conductive layer 1111 is made of, for example, ITO. As shown in FIG. 11B, the first conductive layer 1111 is patterned into a plurality of first electrodes arranged in an array in the first direction D1 and the second direction D2 to correspond to respective sub-pixel regions. This can be achieved by any suitable means, such as photolithography or laser etching.

Figure 11C:
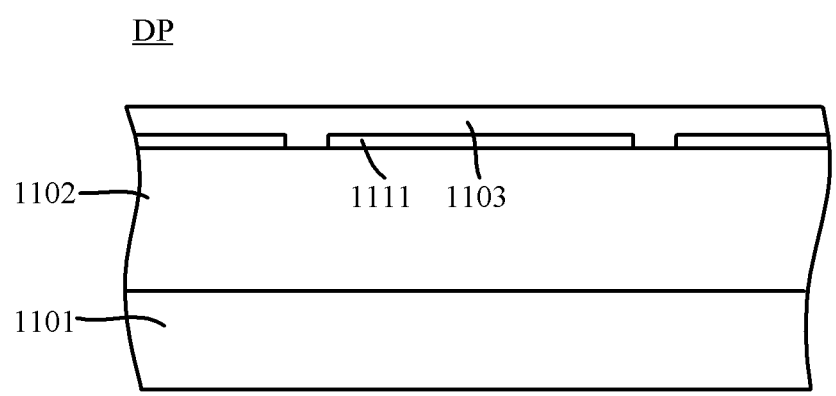

In step 1020, a pixel defining layer is formed on the patterned first conductive layer. As shown in FIG. 11C, a pixel defining layer 1103 is formed on the patterned first conductive layer 1111 to cover each first electrode.

Figure 11D:
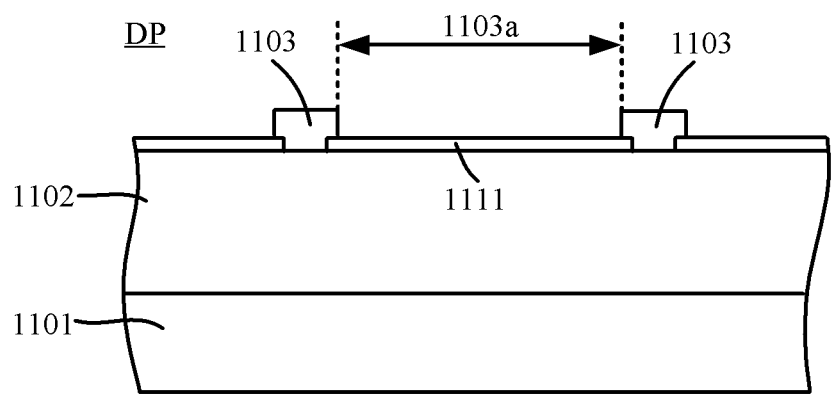

In step 1030, the pixel defining layer is patterned to form a plurality of openings respectively exposing the plurality of first electrodes. As shown in FIG. 11D, the pixel defining layer 1103 is patterned to form a plurality of openings 1103a exposing a corresponding one of the first electrodes 1111, wherein each opening 1103a exposes at least a part of the corresponding first electrode 1111. The first plurality of first electrodes of the first electrodes 1111 are respectively exposed by the first plurality of openings of the plurality of openings 1103a, the second plurality of first electrodes of the first electrodes 1111 are respectively exposed by the second plurality of openings of the plurality of openings 1103a, and the third plurality of first electrodes of the first electrodes 1111 are respectively exposed by the third plurality of openings of the plurality of openings 1103a.

This can be achieved by any suitable means, such as photolithography. In one example, first, a photoresist layer is formed by, for example, spin coating, on the pixel defining layer 1103 shown in FIG. 11C. Then ultraviolet light is used to irradiate the photoresist layer through a photo mask having a pattern corresponding to the plurality of openings 1103a, causing the photoresist in the exposed region to have a chemical reaction. Then, the photoresist in the exposed region is removed by development, so that the pattern of the photo mask is copied to the photoresist layer. Finally, the pattern is transferred to the pixel defining layer 1103 by etching, and the remaining photoresist is removed to obtain a patterned pixel defining layer 1103, as shown in FIG. 11D.

In step 1040, a plurality of first light emitting layers respectively covering the first plurality of openings, a plurality of second light emitting layers respectively covering the second plurality of openings, and a plurality of third light emitting layers respectively covering the third plurality of openings are formed.

The formation of the first light emitting layer is achieved by evaporating the first light emitting material using the first evaporation mask. The first light emitting material is, for example, an organic light emitting material that emits blue light when excited. The formation of the second light emitting layer is achieved by evaporating the second light emitting material using the second evaporation mask. The second light emitting material is, for example, an organic light emitting material that emits red light when excited. The formation of the third light emitting layer is achieved by evaporating the third light emitting material using a third evaporation mask. The third light emitting material is, for example, an organic light emitting material that emits green light when excited.

Figure 11E:
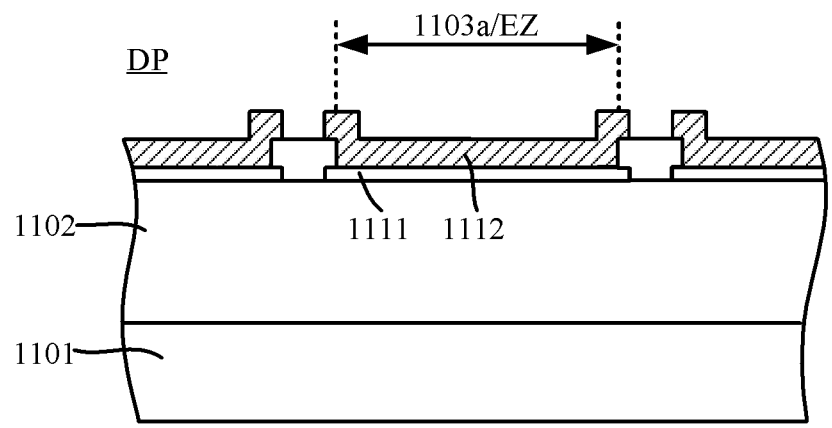

As shown in FIG. 11E, the light emitting layer 1112 is formed on the first electrode 1111 and covers the opening 1103a, and the region of the light emitting layer 1112 that overlaps the opening 1103a forms the light emitting region EZ. Some or all of the openings 1103a may be formed so that the corresponding light emitting zone EZ has the same configuration as those described above with respect to FIG. 2 to FIG. 9. The modification of the shape of the opening 1103a can be achieved by modifying the pattern of the photo mask when the pixel defining layer 1103 is patterned, so as to give the resultant light emitting zone EZ a desired contour.

Figure 11F:
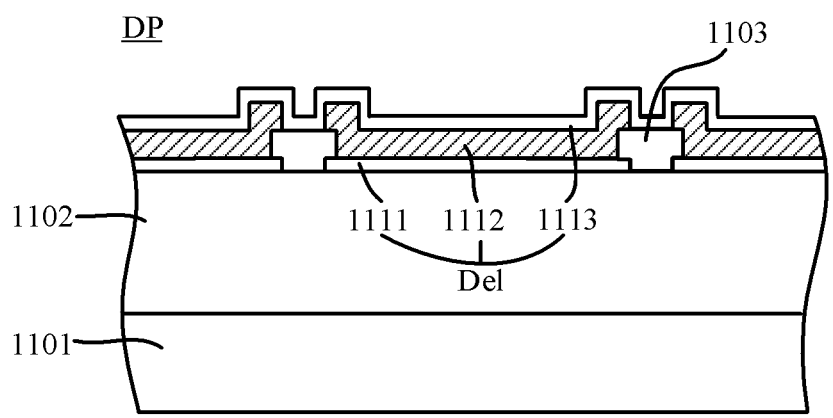

In step 1050, a second conductive layer is formed on each of the first, second, and third light emitting layers. As shown in FIG. 11F, the second conductive layer 1113 is formed on the light emitting layers 1112. The second conductive layer 1113 may be made of, for example, aluminum. The first electrode 1111, the light emitting layer 1112, and the second electrode 1113 form a light emitting diode Del.

The method 1000 provides the same advantages as those described above with respect to the display panel embodiments, which will not be repeated here.

Although the foregoing discussion contains several specific implementation details, these should not be construed as limitations on any disclosure or the scope of protection that may be claimed, but as a description of features that may be limited to specific embodiments of the specific disclosure. Certain features described in different embodiments in this specification can also be implemented in combination in a single embodiment. In contrast, different features described in a single embodiment can also be implemented in multiple embodiments separately or in any suitable sub-combination form. For example, some sub-pixel regions may have the configuration described with respect to FIG. 2 and other sub-pixel regions may have the configuration described with respect to FIG. 5. Similarly, although the various operations are depicted in a specific order in the drawings, this should not be construed as requiring that these operations must be performed in the specific order shown or in a sequential order, nor should it be construed as requiring all shown operations to be performed to obtain the desired result.

In view of the foregoing description and reading the accompanying drawings, various modifications and changes to the foregoing exemplary embodiments of the present disclosure may become clear to those skilled in the relevant art. Any and all modifications will still fall within the scope of the non-limiting and exemplary embodiments of this disclosure. In addition, those skilled in the art to which these embodiments of the present disclosure belong will come to the other embodiments of the present disclosure described herein after benefiting from the teachings given in the foregoing description and related drawings.

What is claimed is:

1. A display panel, including
a plurality of first light emitting layers configured to emit a light of a first color when excited, the first light emitting layers are arranged in an array in a first direction and a second direction intersecting the first direction, each first light emitting layer includes a shaded region, the shaded region is a peripheral region of the first light emitting layer and has a thickness less than a first thickness threshold; and
a pixel defining layer including a plurality of first openings covered by corresponding first light emitting layers, the plurality of first openings defining respective first light emitting zones of the plurality of first light emitting layers,
wherein each first opening has a reduced size in the first direction, so that the corresponding first light emitting zone defined by the first opening has a first misalignment tolerance range in the first direction, and has a second misalignment tolerance range in the second direction, the corresponding first light emitting zone is capable of shifting in the first direction within the first misalignment tolerance range without overlapping the shaded region of the corresponding first light emitting layer, and the corresponding first light emitting zone is capable of shifting in the second direction within the second misalignment tolerance range without overlapping the shaded region of the corresponding first light emitting layer, wherein the first misalignment tolerance range is substantially equal to the second misalignment tolerance range.

2. The display panel of claim 1, wherein the first thickness threshold of the shaded region of each first light emitting layer is a standard thickness of the first light emitting layer multiplied by a percentage, and the standard thickness is a difference between a maximum thickness and a minimum thickness of the first light emitting layer.

3. The display panel of claim 2, wherein the percentage is 98%.

4. The display panel of claim 1, wherein each first opening is formed such that the corresponding first light emitting zone defined by the first opening has a first corner protruding in the first direction and a second corner protruding in the second direction.

5. The display panel of claim 4, wherein the first corner has an edge rounded with a first radius, and the second corner has an edge rounded with a second radius, the first radius is greater than the second radius.

6. The display panel of claim 5, wherein the second radius is greater than or equal to 3 um.

7. The display panel of claim 4, wherein the first corner has an edge substantially parallel to the second direction, and the second corner has an edge rounded with a second radius.

8. The display panel of claim 1, further comprising:
a plurality of second light emitting layers configured to emit a light of a second color when excited, the second light emitting layers are arranged in an array in the first direction and the second direction; and
a plurality of third light emitting layers configured to emit a light of a third color when excited, the third light emitting layers are arranged in an array in the first direction and the second direction,
wherein the pixel defining layer further includes:
a plurality of second openings covered by corresponding second light emitting layers, the plurality of second openings defining respective second light emitting zones of the plurality of second light emitting layers; and
a plurality of third openings covered by corresponding third light emitting layers, the plurality of third openings defining respective third light emitting zones of the plurality of third light emitting layers.

9. The display panel of claim 8, wherein the first light emitting layers, the second light emitting layers, and the third light emitting layers are arranged to form a plurality of repeating units repeatedly arranged in the first direction and the second direction, each repeating unit includes two first light emitting layers, two second light emitting layers and four third light emitting layers,
wherein the two first light emitting layers are respectively arranged in an ith row and a (j+2)th column, and an (i+2)th row and a jth column, the two second light emitting layers are respectively arranged in the ith row and the jth column, and the (i+2)th row and the (j+2)th column, and the four third light emitting layers are respectively arranged in an (i+1)th row and a (j+1)th column, the (i+1)th row and an (j+3)th column, an (i+3)th row and the (j+1)th column, and the (i+3)th row and the (j+3)th column, where i and j are integers greater than or equal to 1.

10. The display panel of claim 9,
wherein each second light emitting layer includes a shaded region, the shaded region is a peripheral region of the second light emitting layer and has a thickness less than a second thickness threshold, and
each second opening has a reduced size in the first direction, so that the corresponding second light emitting zone defined by the second opening has a third misalignment tolerance range in the first direction, and has a fourth misalignment tolerance range in the second direction, the corresponding second light emitting zone is capable of shifting in the first direction within the third misalignment tolerance range without overlapping the shaded region of the second light emitting layers, the corresponding second light emitting zone is capable of shifting in the second direction within the fourth misalignment tolerance range without overlapping the shaded regions of the corresponding second light emitting layer, wherein the third misalignment tolerance range is substantially equal to the fourth misalignment tolerance range.

11. The display panel of claim 10, wherein the second thickness threshold of the shaded region of each second light emitting layer is a standard thickness of the second light emitting layer multiplied by a percentage, and the standard thickness is a difference between a maximum thickness and a minimum thickness of the second light emitting layer.

12. The display panel of claim 11, wherein the percentage is 98%.

13. The display panel of claim 10, wherein each second opening is formed such that the corresponding second light emitting zone defined by the second opening has a third corner protruding in the first direction and a fourth corner protruding in the second direction.

14. The display panel of claim 13, wherein the third corner has an edge rounded with a third radius, and the fourth corner has an edge rounded with a fourth radius, the third radius is greater than the fourth radius.

15. The display panel of claim 14, wherein the fourth radius is greater than or equal to 3 um.

16. The display panel of claim 13, wherein the third corner has an edge substantially parallel to the second direction, and the fourth corner has an edge rounded with a fourth radius.

17. The display panel of claim 10,
wherein the first direction is substantially perpendicular to the second direction,
each of the first light emitting zones has a shape obtained by chamfering each of the four corners of a square, two of the four corners are opposite to each other in the first direction and are rounded or flattened, the other two of the four corners are opposite to each other in the second direction and are rounded,
each of the second light emitting zones has a shape obtained by chamfering each of the four corners of a square, two of the four corners are opposite to each other in the first direction and are rounded or flattened, the other two of the four corners are opposite to each other in the second direction and are rounded, and
each of the third light emitting zones has a shape obtained by chamfering each of the four corners of a rectangle, and the four corners are rounded or flattened, wherein each third light emitting zone is oriented such that a long side of the rectangle is opposite to a side of the corresponding first light emitting zone directly adjacent to the third light emitting zone and is substantially parallel to the side of the corresponding first light emitting zone, and a short side of the rectangle is opposite to a side of the corresponding second light emitting zone directly adjacent to the third light emitting zone and substantially parallel to the side of the corresponding second light emitting zone.

18. The display panel of claim 1, wherein the first direction is a direction along which evaporation sources are arranged in an evaporation process of the display panel, and the second direction is a direction along which the evaporation sources moves in the evaporation process.

19. A method of manufacturing a display panel, including
patterning a first conductive layer to form a plurality of first electrodes, wherein the first electrodes are arranged in an array in a first direction and a second direction crossing the first direction;
forming a pixel defining layer on the patterned first conductive layer;

patterning the pixel defining layer to form a plurality of openings respectively exposing the plurality of first electrodes, wherein each opening exposes at least a part of the corresponding first electrode, and a first plurality of first electrodes among the plurality of first electrodes are respectively exposed by a first plurality of openings among the plurality of openings, a second plurality of first electrodes among the plurality of first electrodes are respectively exposed by a second plurality of openings among the plurality of openings, and a third plurality of first electrodes in the plurality of first electrodes are respectively exposed by a third plurality of openings among the plurality of openings;

forming a plurality of first light emitting layers respectively covering the first plurality of openings, a plurality of second light emitting layers respectively covering the second plurality of openings, and a plurality of third light emitting layers respectively covering the third plurality of openings, wherein the first plurality of openings define respective first light emitting zones of the plurality of first light emitting layers; and forming a second conductive layer on the first light emitting layers, the second light emitting layers and the third light emitting layers, wherein each first light emitting layer includes a shaded region, the shaded region is a peripheral region of the first light emitting layer and has a thickness less than a thickness threshold, and each of the first plurality of openings has a reduced size in the first direction, so that the corresponding first light emitting zone defined by the opening has a first misalignment tolerance range in the first direction, and has a second misalignment tolerance range in the second direction, the corresponding first light emitting zone is capable of shifting in the first direction within the first misalignment tolerance range without overlapping with the shaded region of the corresponding first light emitting layer, the corresponding first light emitting zone is capable of shifting in the second direction within the second misalignment tolerance range without overlapping with the shaded region of the corresponding first light emitting layer, wherein the first misalignment tolerance range is substantially equal to the second misalignment tolerance range.

20. The method of claim 19, wherein the thickness threshold of the shaded region of each first light emitting layer is a standard thickness of the first light emitting layer multiplied by a percentage, and the standard thickness is a difference between a maximum thickness and a minimum thickness of the first light emitting layer.

21. The method of claim 20, wherein the percentage is 98%.

22. The method of claim 19, wherein forming the first light emitting layers, the second light emitting layers, and the third light emitting layers comprises respectively evaporating a first light emitting material, a second light emitting material, and a third light emitting material by an evaporation process, the first direction is a direction along which evaporation sources are arranged in the evaporation process, and the second direction is the direction along which the evaporation sources move in the evaporation process.

* * * * *